(12) United States Patent
Ivanov et al.

(10) Patent No.: US 8,453,487 B2
(45) Date of Patent: Jun. 4, 2013

(54) CIRCULAR GROOVE PRESSING MECHANISM AND METHOD FOR SPUTTERING TARGET MANUFACTURING

(75) Inventors: Eugene Y. Ivanov, Grove City, OH (US); Erich Theado, Columbus, OH (US); David B. Smathers, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 253 days.

(21) Appl. No.: 12/998,328

(22) PCT Filed: Oct. 9, 2009

(86) PCT No.: PCT/US2009/005572
§ 371 (c)(1),
(2), (4) Date: Apr. 21, 2011

(87) PCT Pub. No.: WO2010/042227
PCT Pub. Date: Apr. 15, 2010

(65) Prior Publication Data
US 2011/0219847 A1   Sep. 15, 2011

Related U.S. Application Data

(60) Provisional application No. 61/195,800, filed on Oct. 10, 2008.

(51) Int. Cl.
*B21D 37/00* (2006.01)
*B21D 31/00* (2006.01)

(52) U.S. Cl.
USPC ...... 72/414; 72/379.2; 72/379.6; 204/298.09; 204/298.12; 204/298.14

(58) Field of Classification Search
USPC .... 72/364, 379.2, 412, 414, 415; 204/298.09, 204/298.12, 298.13, 298.14; 148/559
See application file for complete search history.

(56) References Cited

U.S. PATENT DOCUMENTS

| 3,444,589 A | 5/1969 | Bowin |
| 4,317,350 A | 3/1982 | Sivachenko et al. |

(Continued)

FOREIGN PATENT DOCUMENTS

| EP | 1714715 A2 | 10/2006 |
| JP | 5186769 A | 7/1993 |

(Continued)

OTHER PUBLICATIONS

International Search Report and Written Opinion mailed Feb. 9, 2010 for PCT/US2009/005572 filed Oct. 9, 2009.

(Continued)

*Primary Examiner* — David B Jones
(74) *Attorney, Agent, or Firm* — Wegman, Hessler & Vanderburg

(57) ABSTRACT

A method of making metal target blank using circular groove pressing includes pressing a metal or metal alloy target blank in a first circular grooved pressing die set into a first concentric corrugated shape while maintaining an original diameter of the target blank to create concentric rings of shear deformation in the target blank. Forces are then applied to the concentric corrugated target blank sufficient to substantially flatten the target blank with a flat die set while maintaining the original diameter of the target blank to restore the target blank to a substantially flat condition. The target blank is pressed in a second circular grooved die set into a second concentric corrugated shape while maintaining the original diameter of the target blank, wherein the second die set has a groove pattern offset from a groove pattern of the first die set so as to create concentric rings of shear deformation in areas of the target blank which were not previously deformed. Forces are again applied to the concentric corrugated target blank sufficient to substantially flatten the target blank with a flat die set while maintaining the original diameter of the target blank to restore the target blank to a substantially flat condition.

8 Claims, 6 Drawing Sheets

U.S. PATENT DOCUMENTS

| | | | |
|---|---|---|---|
| 4,455,852 A | | 6/1984 | Paton et al. |
| 4,635,462 A | | 1/1987 | Bald |
| 4,885,075 A | * | 12/1989 | Hillman .................. 204/298.09 |
| 5,687,600 A | | 11/1997 | Emigh et al. |
| 5,775,060 A | | 7/1998 | Ferrero |
| 5,983,692 A | | 11/1999 | Bruck |
| 5,988,262 A | | 11/1999 | Hasegawa et al. |
| 6,197,134 B1 | | 3/2001 | Kanzaki et al. |
| 6,521,106 B1 | | 2/2003 | Actor et al. |
| 6,908,517 B2 | | 6/2005 | Segal et al. |
| 6,942,763 B2 | | 9/2005 | Perry et al. |
| 7,288,158 B2 | | 10/2007 | Thomson et al. |
| 7,708,868 B2 | * | 5/2010 | Smathers et al. ........ 204/298.12 |
| 7,882,612 B2 | * | 2/2011 | Dehe et al. .................. 29/594 |
| 8,029,629 B2 | * | 10/2011 | Hukushima .................. 148/559 |
| 8,037,727 B2 | * | 10/2011 | Bailey et al. .................... 72/60 |
| 2001/0029767 A1 | | 10/2001 | Adams et al. |
| 2003/0075437 A1 | | 4/2003 | Marx et al. |
| 2004/0025986 A1 | | 2/2004 | Perry et al. |
| 2006/0283529 A1 | | 12/2006 | Ghosh et al. |
| 2007/0209741 A1 | | 9/2007 | Carpenter et al. |
| 2011/0219847 A1 | * | 9/2011 | Ivanov et al. .................. 72/412 |

FOREIGN PATENT DOCUMENTS

| | | |
|---|---|---|
| WO | WO8607563 A1 | 12/1986 |
| WO | WO9409927 A1 | 5/1994 |

OTHER PUBLICATIONS

International Preliminary Report on Patentability mailed Apr. 12, 2011 for PCT/US2009/005572 filed Oct. 9, 2009.

* cited by examiner

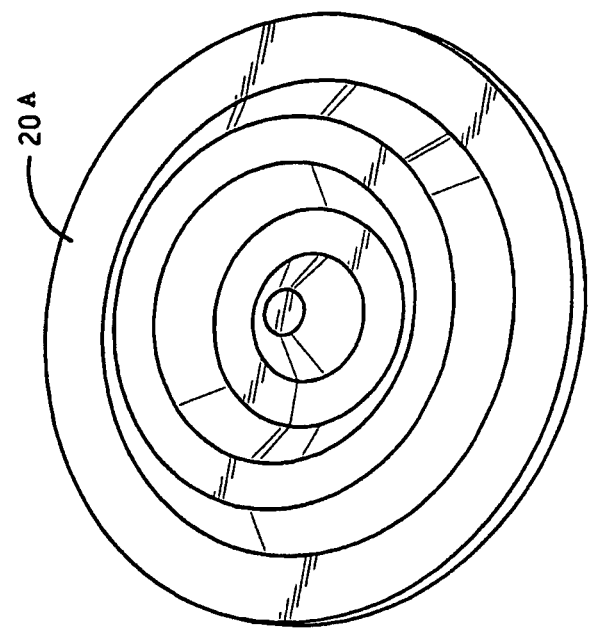
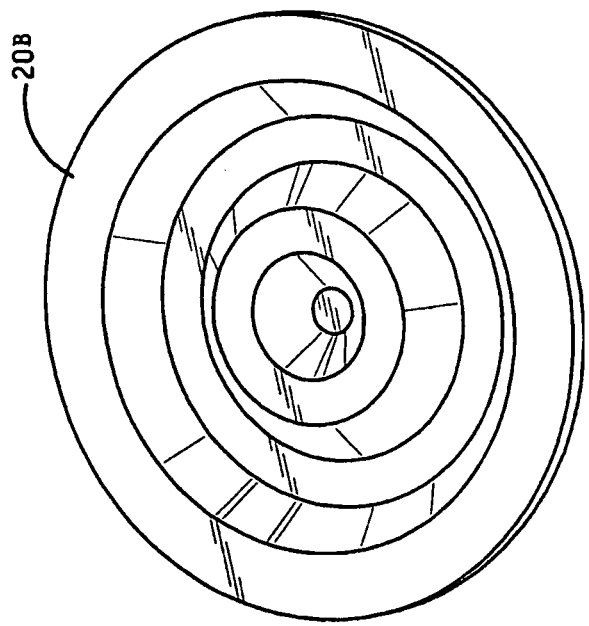
FIG.-2A

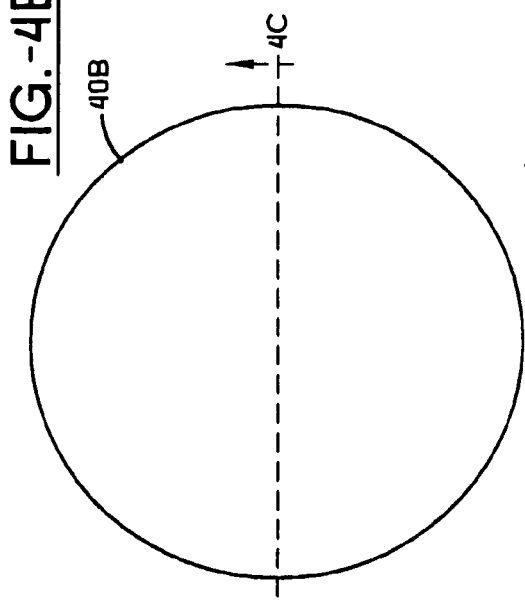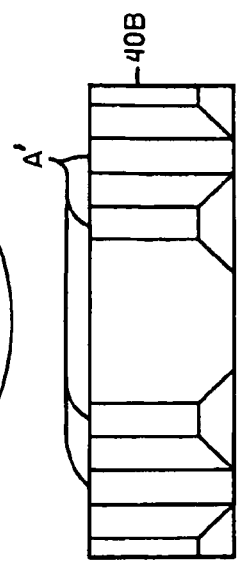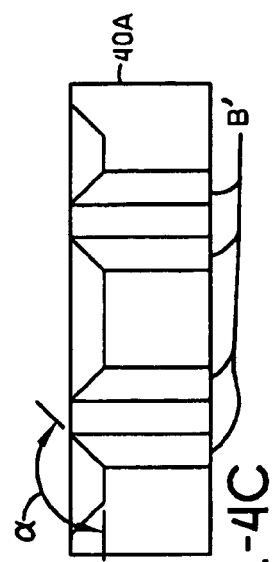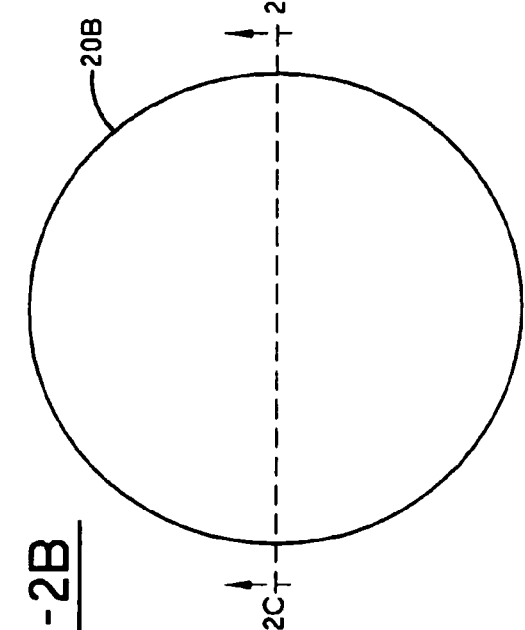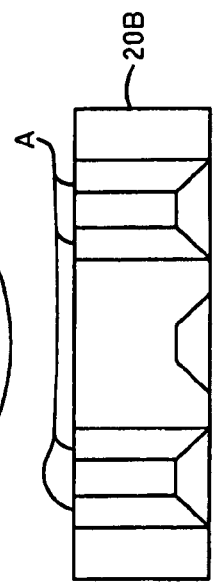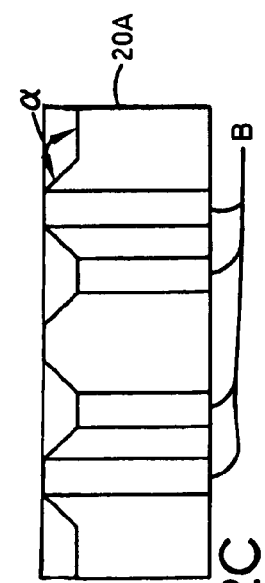

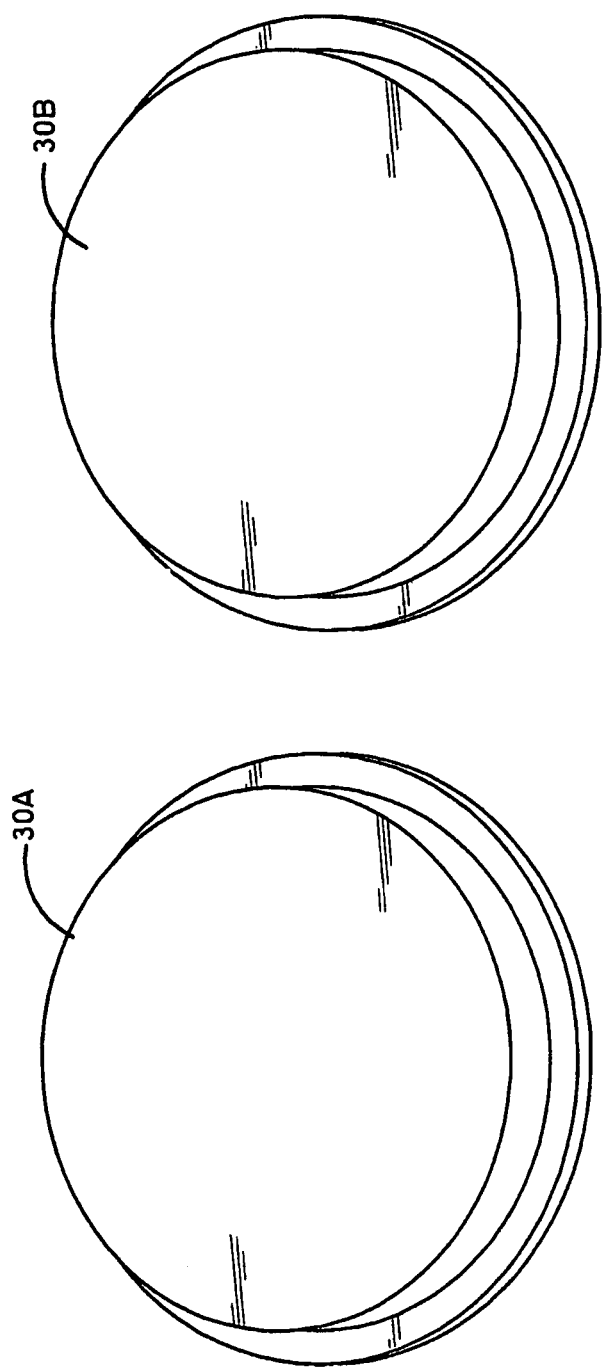

CIRCULAR GROOVE PRESSING MECHANISM AND METHOD FOR SPUTTERING TARGET MANUFACTURING

CROSS REFERENCE TO RELATED APPLICATIONS

This application claims the priority benefit of U.S. Provisional Patent Application Ser. No. 61/195,800 filed Oct. 10, 2008.

BACKGROUND OF THE INVENTION

1. Field of Invention

The present invention relates generally to the field of sputtering targets, and more particularly, to a method of making sputtering targets using circular groove pressing.

2. Description of Related Art

Sputtering targets require certain metallographic attributes in order to achieve acceptable sputtering uniformity. Typically, metal targets are made by a combination manufacturers have relied upon several processing techniques to manufacture sputter targets from aluminum alloys such as, aluminum-copper, aluminum-silicon and aluminum-silicon-copper alloys. Manufacturers have traditionally relied upon a combination of thermo-mechanical processing including forging, pressing, annealing and rolling to produce a fine-grained aluminum alloy target. The annealing recrystallizes the grains to produce a useful grain texture for sputtering. The final grain size of these annealed targets typically ranges from 30 to 75 μm.

Most of the targets used for semiconductor manufacturing are in disc shape and have cylindrical symmetry. However, typical thermo-mechanical treatments are predominantly based on uniaxial pressing, forging and one directional rolling. To prevent formation of a directional texture, cross rolling is sometimes used.

SUMMARY OF THE INVENTION

The present invention provides a method of making metal target blank using circular groove pressing. The method includes pressing a metal or metal alloy target blank in a first circular grooved pressing die set into a first concentric corrugated shape while maintaining an original diameter of the target blank to create concentric rings of shear deformation in the target blank. Next, forces are applied to the concentric corrugated target blank sufficient to substantially flatten the target blank with a flat die set while maintaining the original diameter of the target blank to restore the target blank to a substantially flat condition. The method then includes pressing the target blank in a second circular grooved die set into a second concentric corrugated shape while maintaining the original diameter of the target blank, wherein the second die set has a groove pattern offset from a groove pattern of the first die set so as to create concentric rings of shear deformation in areas of the target blank which were not previously deformed. Then, forces are again applied to the concentric corrugated target blank sufficient to substantially flatten the target blank with a flat die set while maintaining the original diameter of the target blank to restore the target blank to a substantially flat condition.

The invention is also directed to a circular groove pressing mechanism for producing a sputtering target blank. The circular groove pressing mechanism includes a first grooved die set for circular corrugating the target blank with grooves and a second grooved die set for corrugating the target blank in areas not deformed in the first die set with groove dimensions equal to groove dimensions in the first die. The mechanism also includes a die set for flattening the target blank to be used with the target blank intermediate the first and second die sets.

These and other features and advantages of the present invention are illustrated in the accompanying drawings, and are more fully disclosed in the following detailed description.

BRIEF DESCRIPTION OF THE DRAWINGS

The structure, operation, and advantages of the presently disclosed embodiments of the invention will become apparent when consideration of the following description is taken in conjunction with the accompanying drawings, wherein:

FIG. 2A is a perspective view of a first die set used with the press for with the circular groove pressing;

FIG. 2B is a plan view of the first die set of FIG. 2A;

FIG. 2C is a cross sectional view of the first die set taken along the line 2C-2C of FIG. 2B;

FIG. 3 is a perspective view of a flat die set used with the press for circular groove pressing;

FIG. 4B is a plan view of the second die set of FIG. 4A;

FIG. 4C is a cross sectional view of the second die set taken along the line 4C-4C of FIG. 4B;

Corresponding reference characters indicate corresponding parts throughout the views of the drawings.

DETAILED DESCRIPTION OF INVENTION

The invention will now be described in the following detailed description with reference to the drawings, wherein exemplary embodiments are described in detail to enable practice of the invention. Although the invention is described with reference to specific exemplary embodiments, it will be understood that the invention is not limited to these exemplary embodiments. To the contrary, the invention includes numerous alternatives, modifications, and equivalents as will become apparent from consideration of the following detailed description.

Figure 1:
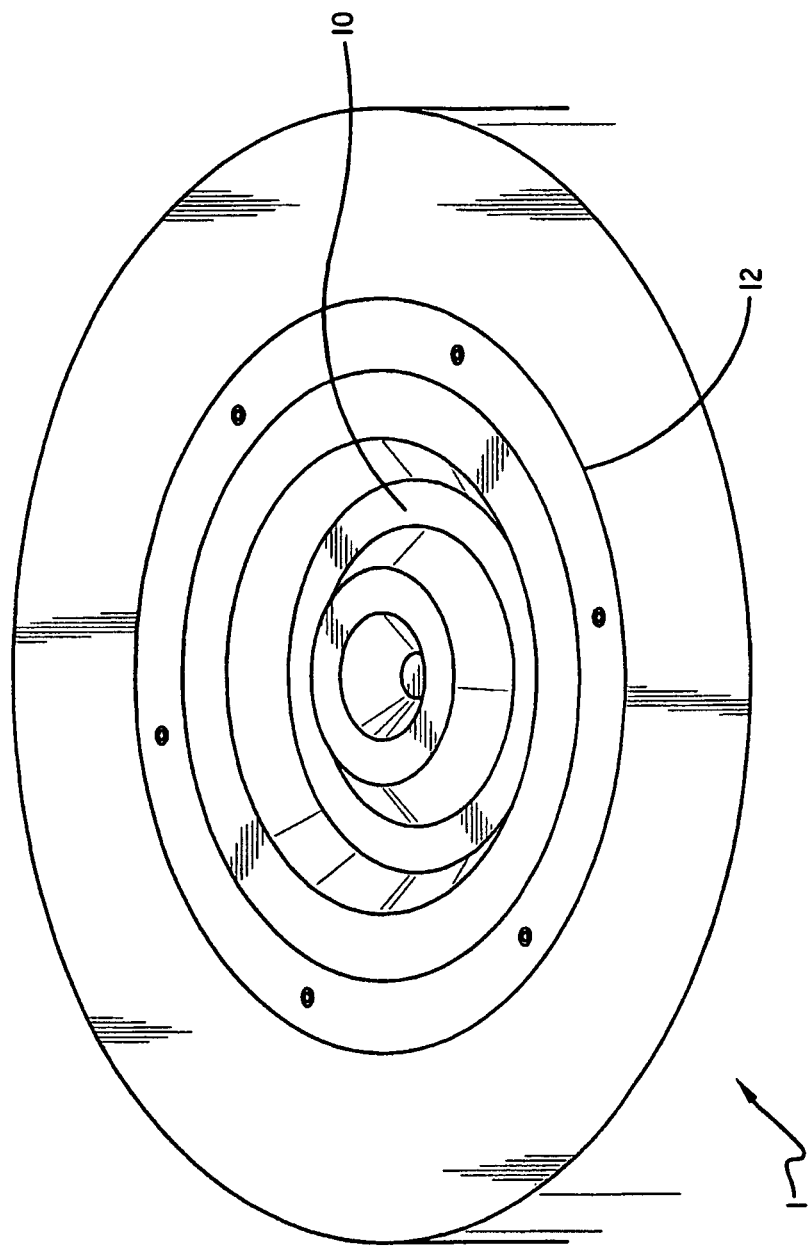
FIG. 1 is a perspective view of a portion of a press used for circular groove pressing with a target blank according to an exemplary embodiment of the invention.

Turning now to the Figures, the present invention provides a method of making a monolithic sputtering target using circular groove pressing with press 1 as seen in FIG. 1. The method includes initially inserting a generally flat and circularly shaped target blank 10 into the press 1. The target blank can be made of any ductile metal or alloy including Al, Al alloys, Cu and Cu alloys, Ta and Ta alloys, and other metals which can be plastically deformed at room or elevated temperature. As will be described below, a plurality of dies are used with the press 1 to create shear deformation in the target blank 10. In one embodiment, the target blank has a diameter of about 13 inches (33 cm) and a thickness of 1.25 inches (3.175 cm), although other dimensions may be used without departing from the scope of the invention.

During a first pressing step, a first set of dies, comprising lower die 20A and upper die 20B as seen in FIGS. 2A-C, is used with the press 1. A containment cylinder 12 is used to maintain the diameter of the pressed target blank 10 substantially constant during the pressing steps. The first die set 20A, 20B have one or more concentric grooves formed therein. As seen in the sectional view of the die set 20A, 20B in FIG. 2C, the grooves are formed by concentric portions of the dies labeled by reference A which have sloped walls. The sloped walls desirably have an angle α desirably in the range of between about 120° and about 150°, and more desirably with an angle α of 135°. Other portions of the die set, labeled with reference B, are flat. For clarity, not all portions of the die set are labeled, and one skilled in the art will understand that the different numbers of grooves may be formed in the die set 20A, 20B by varying the width of the sloped portions and flat portions and/or by varying the diameter of the die set based on sound engineering judgment.

When pressing the target blank 10 in this first step, the facing surfaces of the upper and lower dies 20A, 20B come together until they are separated by a distance substantially equal to the thickness of the target blank. The force applied to the target blank 10 with the press 1 causes those areas of the target blank between the sloped portions A of the dies 20A, 20B to be pressed into a concentric corrugated shape by undergoing shear deformation. Those areas of the target blank 10 between the flat portions B of the dies 20A, 20B do not undergo any substantial shear deformation. The containment cylinder 12 maintains the diameter of the pressed target blank 10 substantially constant during the pressing steps. Thus, the first die set 20A, 20B is initially used in the press 1 to create concentric rings of shear deformation in certain concentric portions of the target blank 10. FIG. 1 shows the target blank in the containment ring with the bottom plate 20A removed after the first pressing step such that the target blank has concentric ring portions that have undergone shear deformation.

In a second step, the first set of dies 20A, 20B are replaced with a set of flat dies 30A, 30B with identical bottom and top flats as seen in FIG. 3. A force is applied to the concentric corrugated target blank sufficient for restoration of substantially flat surfaces with the set of flat dies 30A, 30B. Of course, one skilled in the art will understand that the same press 1 may be used for each step of the process by replacing the dies, or the target blank can be moved from a first press 1 having the first set of dies to a second press having the second set of dies without departing from the scope of the invention. This also applies to each subsequent step described below. The containment cylinder 12 confines the diameter of the target blank 10 at a substantially consistent diameter during the second pressing step.

Figure 4A:
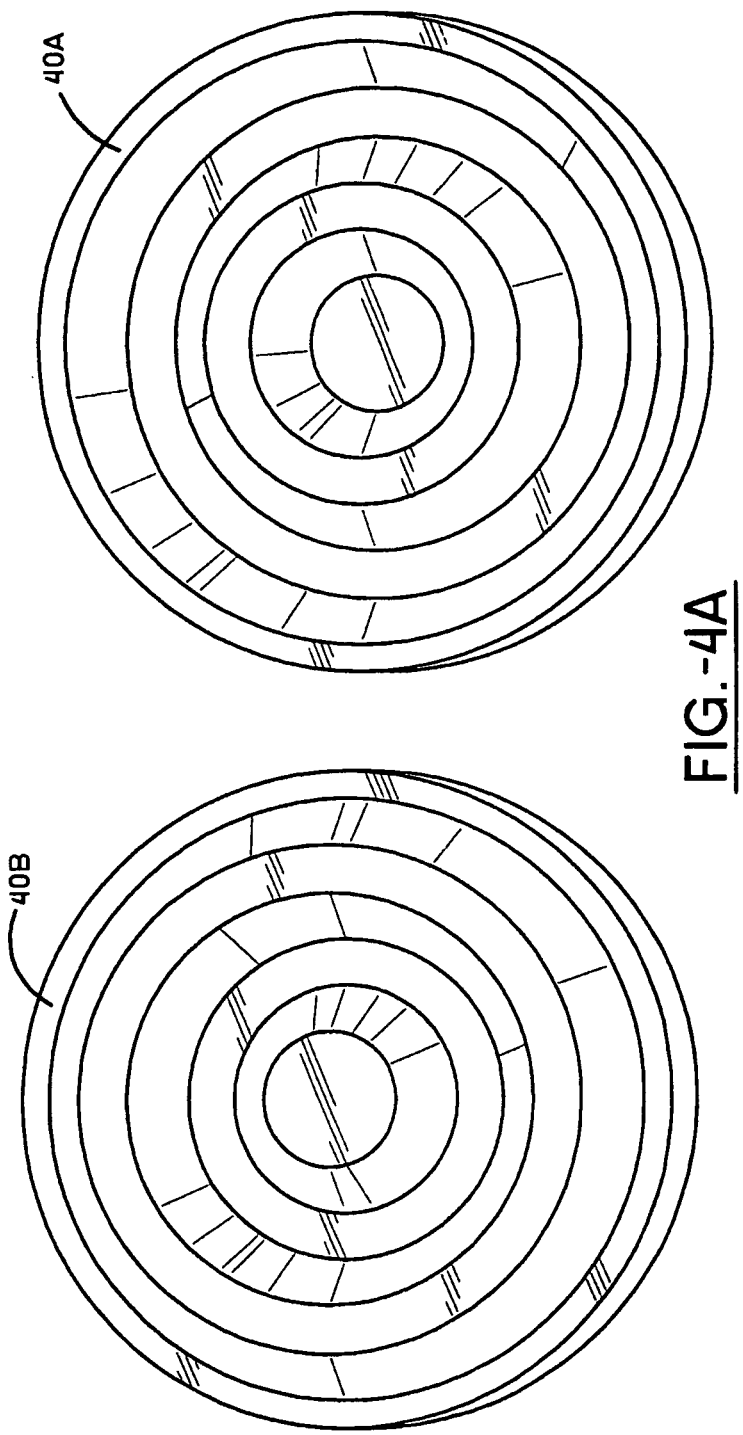
FIG. 4A is a perspective view of a second die set used with the press for with the circular groove pressing.

In a third step, a second set of grooved dies, comprising lower die 40A and upper die 40B as seen in FIGS. 4A-C, is used with the press 1. The containment cylinder 12 also maintains the diameter of the pressed target blank 10 substantially constant during this pressing step. The second die set 40A, 40B also have one or more concentric grooves formed therein for circular corrugating the target blank 10 with groove dimensions equal to grooves in first die set but offset, for example by one period, such that the second die set corrugates the target blank 10 in areas not deformed by the first die set 20A, 20B. As seen in the sectional view of the second die set 40A, 40B in FIG. 4C, the grooves in the second die set are offset from the grooves in the first set such that the concentric portions of the dies labeled by reference A' which now have flat walls and other portions of the die set, labeled with reference B', now have sloped walls. When pressing the target blank 10 in this third step, the facing surfaces of the upper and lower dies 40A, 40B come together until they are separated by a distance substantially equal to the thickness of the target blank in order to deform portions of the target blank which were not deformed in the first step. The force applied to the target blank 10 with the press 1 causes those areas of the target blank between the sloped portions B' of the dies 40A, 40B to undergo shear deformation. Those areas of the target blank 10 between the flat portions A' of the dies 40A, 40B do not undergo any substantial shear deformation. The containment cylinder 12 maintains the diameter of the pressed target blank 10 substantially constant during the pressing step. Thus, the second die set 40A, 40B is used in the press 1 to create shear deformation in the offset concentric portions of the target blank 10 that did not undergo shear deformation in the first pressing step described above.

In a fourth step, the flat dies 30A, 30B with identical bottom and top flats are used to again flatten the target blank 10 while the containment cylinder 12 confines the diameter of the target blank 10 at a substantially consistent diameter.

The target blank is then used to make a sputtering target or may be subjected to additional pressing in the grooved dies to accumulate more deformation, if desired. Thus, one skilled in the art will understand that the pressing steps may be repeated until the target blank piece is transformed into a product with desirable microstructure, refined grain size and improved mechanical properties (i.e., strength). The circular groove pressing creates a target blank 10 which has cylindrical symmetry, and thus, provides cylindrical symmetry to the target blank metallurgy.

After undergoing the above described circular groove pressing, the target blank 10 may have other beneficial qualities besides increased strength. The pressing sequence develops texture in the target blank 10 which is not achievable by conventional rolling. After testing is completed using a magnet optimized for strong <200> texture material, it is believed that the circular groove pressing process tilts the <200> direction about 45 degrees. Thus, it may be possible to steer the sputtering beam so that a smaller diameter target may produce improved uniformity. As wafer diameters have increased, the target diameter has proportionately increased. If the sputter target could be closer to the wafer size, it is believed that more efficient chambers could be produced. The radially-tilted texture could be combined with a magnet optimized for the tilt to make more material and space efficient physical vapor deposition systems.

Optionally, the circular groove pressing process may also include annealing the target blank after one or more of the four pressing steps. Additionally, in one embodiment, the target blank is heated and/or cooled prior to one or more of the pressing steps.

EXAMPLE 1

An Al-0.2% Si-0.5% Cu alloy ingot was pressed and rolled to form a plate of having a 13 inch diameter and 1.25 inch in thickness. The target blank was circular groove pressed using two cycles of groove pressing and two cycles of flattening so that final plate was also of 13 inch diameter by 1.25 inch in thickness. No annealing was performed.

The target blank was then machined to form a 12.5 inch DIA×1.1" target blank and was analyzed to measure mechanical properties of the circular pressed material. Standard test samples were cut out of the processed plate and tensile strength was measured. Results are presented in Table 1.

TABLE 1

| sample | Max. Load (lbf) | Strain at Max Load Load (psi) | Stress at Max. Load (psi) | Modulus (E-modulus) (kpsi) | Strain at 0.2% yield (kpsi) | Stress at 0.2% yield (psi) |
|---|---|---|---|---|---|---|
| Original plate 1 | 1694 | 9.154 | 13368 | 7678 | 1.327 | 10494 |
| Original plate 2 | 1709 | 8.676 | 13432 | 9144 | 0.300 | 10625 |
| Original plate 3 | 1683 | 9.061 | 13227 | 6277 | 0.349 | 10189 |
| Processed plate 1 | 2401 | 0.419 | 19248 | 18753 | 0.281 | 19084 |
| Processed plate 2 | 2507 | 0.499 | 19627 | 8215 | 0.427 | 19530 |
| Processed plate 3 | 2476 | 0.507 | 19539 | 12850 | 0.344 | 19369 |

Thus, it appears that the processed material has increased tensile strength by about 50% over the original material.

EXAMPLE 2

An Al-0.2% Si-0.5% Cu alloy ingot was pressed and rolled to form a plate of 13 inch DIA×1.25 thickness and used to produce circular groove pressed target blank. Two cycles of groove pressing and two cycles of flattening were used so that final plate was also 13"DIA×1.25"thick. No anneal was used in this case.

This target blank was then machined to form a 12.5" DIA× 1.1" target blank and was analyzed to measure crystalline grain size uniformity of the circular pressed material. Results are presented in Table 2.

TABLE 2

| | Grain size, microns | | | |
|---|---|---|---|---|
| Sample location | Normal view | | Transverse view | |
| Center (0") | 34.4 | 32.3 | 27.7 | 30.1 |
| Mid radius (6") | 27.7 | 28.9 | 27.7 | 28.7 |
| Radius (12") | 27.8 | 27.9 | 30.5 | 31.2 |

EXAMPLE 3

An Al-0.2% Si-0.5% Cu alloy ingot was pressed and rolled to form a plate of 13" DIA×1.25" thick, then this target blank was used to produce a circular groove pressed target blank. We used two cycles of groove pressing and two cycles of flattening so that the final plate was also 13"DIA×1.25"thick. No anneal was used in this case.

This target blank was then machined to form 12.5" DIA× 1.1" target blank and was used to make standard Endura target (12.98" DIX×0.25" thick) which then was sputtered to study the uniformity of thin film deposition.

Figure 5:
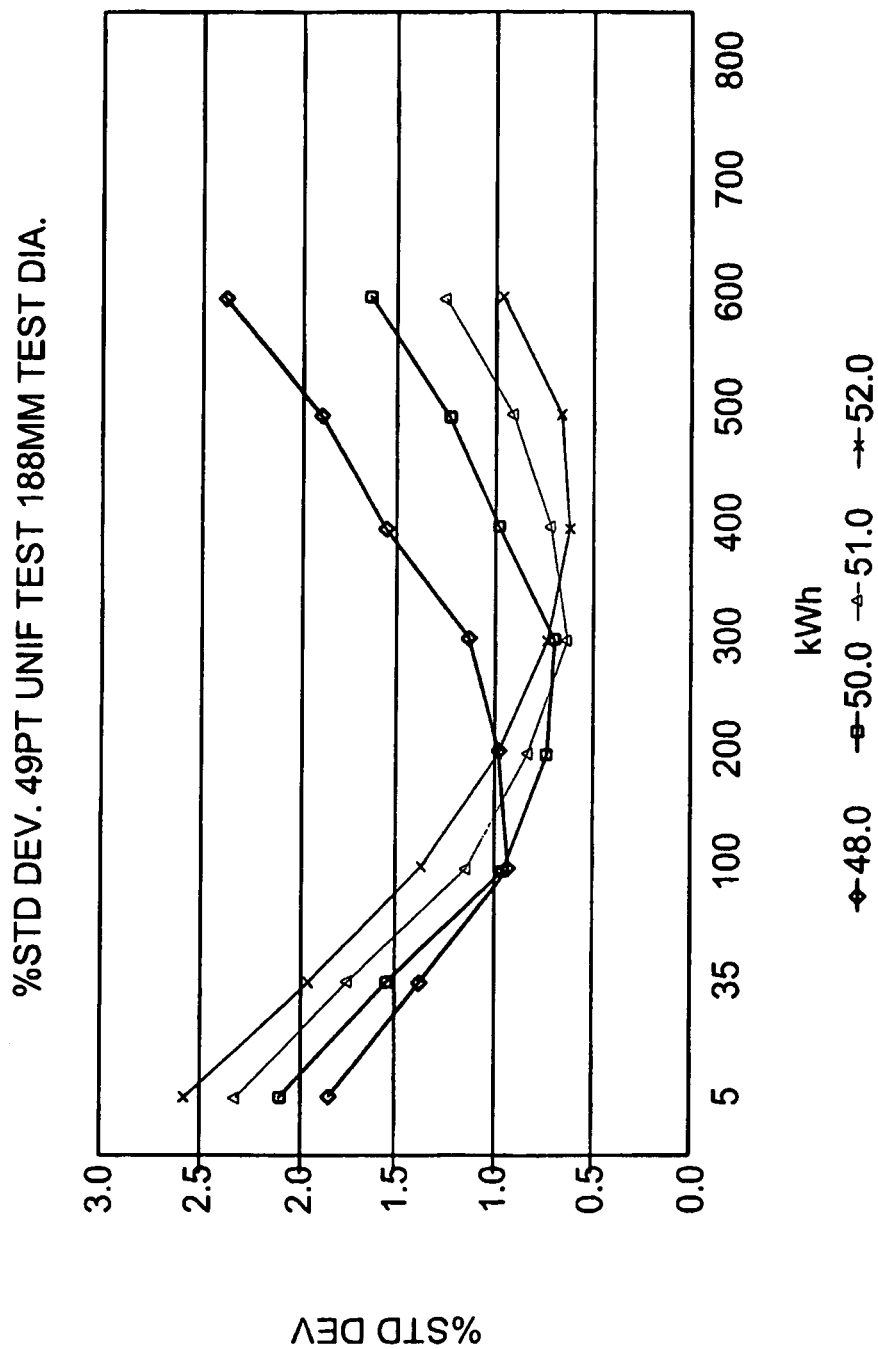
FIG. 5 shows the results of a percent standard deviation 49 point resistivity test on a target made using circular groove pressing g is a side elevation view of the two-pedal lift mechanism illustrated in a raised transport position.

FIG. 5 shows that uniformity of the film was at acceptable level of <2.5% measured by standard 49 point resistivity probe.

While the invention has been shown and described with respect to certain exemplary embodiments, it is apparent that equivalent alterations and modifications will occur to others skilled in the art upon reading and understanding of the specification. The present invention includes all such equivalent alterations and modifications and is limited only by the scope of the claims.

What is claimed is:

1. A method of making metal target blank using circular groove pressing comprising the steps of:
   a. pressing a metal or metal alloy target blank in a first circular grooved pressing die set into a first concentric corrugated shape while maintaining an original diameter of the target blank to create concentric rings of shear deformation in the target blank;
   b. applying forces to the concentric corrugated target blank sufficient to substantially flatten the target blank with a flat die set while maintaining the original diameter of the target blank to restore the target blank to a substantially flat condition;
   c. pressing the target blank in a second circular grooved die set into a second concentric corrugated shape while maintaining the original diameter of the target blank, wherein the second die set has a groove pattern offset from a groove pattern of the first die set so as to create concentric rings of shear deformation in areas of the target blank which were not deformed in step a); and
   d. applying forces to the concentric corrugated target blank sufficient to substantially flatten the target blank with a flat die set while maintaining the original diameter of the target blank to restore the target blank to a substantially flat condition.

2. The method of claim 1, wherein the second grooved die set has concentric grooves formed therein for circular corrugating the target blank with groove dimensions substantially equal to groves in the first die set but offset by one period.

3. The method of claim 1, the process further comprising repeating steps a), b), c) and d).

4. The method of claim 1, the process further comprising the step of annealing the target blank after one or more of steps a)-d).

5. The method of claim 1, the process further comprising the step of heating the target blank before one or more of steps a)-d).

6. The method of claim 1, the process further comprising the step of cooling the target blank before one or more of steps a)-d).

7. A circular groove pressing mechanism for producing a sputtering target blank, the circular groove pressing mechanism comprising;
   a. a first grooved die set for circular corrugating the target blank with grooves;
   b. a second grooved die set for corrugating the target blank in areas not deformed in the first die set with grooves dimensions equal to groove dimensions in the first die; and
   c. a die set for flattening the target blank.

8. The circular groove pressing mechanism of claim 7 wherein the second grooved die set has concentric grooves formed therein for circular corrugating the target blank with groove dimensions substantially equal to groves in the first die set but offset by one period.

* * * * *